US009753089B2

(12) United States Patent
 Suzuki

(10) Patent No.: US 9,753,089 B2
(45) Date of Patent: Sep. 5, 2017

(54) BATTERY CELL MONITORING CIRCUIT AND BATTERY CELL MONITORING SYSTEM

(71) Applicant: Kabushiki Kaisha Toshiba, Tokyo (JP)

(72) Inventor: Atsuhisa Suzuki, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 1172 days.

(21) Appl. No.: 13/791,393

(22) Filed: Mar. 8, 2013

(65) Prior Publication Data

US 2013/0261815 A1    Oct. 3, 2013

(30) Foreign Application Priority Data

Mar. 26, 2012  (JP) ................................ 2012-070198

(51) Int. Cl.
  *G01R 31/36* (2006.01)
  *G06F 1/26* (2006.01)
  (Continued)

(52) U.S. Cl.
  CPC ..... *G01R 31/3606* (2013.01); *G01R 31/3648* (2013.01); *G01R 31/3658* (2013.01);
  (Continued)

(58) Field of Classification Search
  CPC ....... G01R 31/3606; G01R 31/36; G06F 1/26; G06K 19/0707; H03L 7/0995; H01Q 1/2225
  (Continued)

(56) References Cited

U.S. PATENT DOCUMENTS 4,394,741 A * 7/1983 Lowndes ............ B60L 11/1853
                                                       320/100
4,458,337 A * 7/1984 Takemae ............ H03K 3/35606
                                                       326/70
(Continued)

FOREIGN PATENT DOCUMENTS

JP       2006-029895           2/2006
JP       2006-029895 A         2/2006
(Continued)

OTHER PUBLICATIONS

Japanese Office Action, Patent Application No. 2012-070198, dated Jun. 20, 2014.

*Primary Examiner* — Richard Isla Rodas
*Assistant Examiner* — Dung V Bui
(74) *Attorney, Agent, or Firm* — Patterson & Sheridan, LLP

(57) ABSTRACT

A battery cell monitoring system includes multiple battery monitoring circuits, each connected to a corresponding battery cell, and a microcomputer for controlling the monitoring circuits. The battery monitoring circuits include a data output circuit that outputs a data signal corresponding to the monitoring results for the battery cell monitored thereby and a multiplexer that outputs either the monitoring results received from the data output circuit or monitoring results received from another battery monitoring circuit. The battery cell monitoring circuit includes a flip-flop circuit receiving a clock signal and the signal output from the multiplexer which is latched in synchronization with the clock signal.

16 Claims, 3 Drawing Sheets

(51) Int. Cl.
  *G06F 1/04* (2006.01)
  *G06F 1/32* (2006.01)
(52) U.S. Cl.
  CPC ............... *G06F 1/04* (2013.01); *G06F 1/26* (2013.01); *G06F 1/263* (2013.01); *G06F 1/3212* (2013.01); *Y02B 60/1292* (2013.01)
(58) Field of Classification Search
  USPC .............................. 320/116; 700/286; 702/63
  See application file for complete search history.

(56) References Cited

U.S. PATENT DOCUMENTS

| | | | | |
|---|---|---|---|---|
| 5,206,578 | A * | 4/1993 | Nor ................... | G01R 31/3658 320/118 |
| 6,031,354 | A * | 2/2000 | Wiley ................ | G01R 31/3648 320/116 |
| 7,394,394 | B2 * | 7/2008 | Lockhart .......... | G01R 19/16542 320/116 |
| 2001/0011881 | A1 * | 8/2001 | Emori .............. | G01R 19/16542 320/116 |
| 2006/0012337 | A1 | 1/2006 | Hidaka et al. | |
| 2009/0198399 | A1 * | 8/2009 | Kubo .................. | B60L 11/1855 701/22 |
| 2010/0173180 | A1 | 7/2010 | Li | |
| 2010/0280786 | A1 | 11/2010 | Gorbold et al. | |
| 2010/0327806 | A1 * | 12/2010 | Brisebois ........... | G01R 31/3658 320/116 |
| 2011/0025270 | A1 | 2/2011 | Nakanishi | |
| 2013/0261815 | A1 * | 10/2013 | Suzuki .............. | G01R 31/3606 700/286 |

FOREIGN PATENT DOCUMENTS

| | | |
|---|---|---|
| JP | 2007-187649 A | 7/2007 |
| JP | 2009-014498 A | 1/2009 |
| JP | 2009-156633 A | 7/2009 |
| JP | 2010-161918 | 7/2010 |
| JP | 2011-181392 A | 9/2011 |

* cited by examiner

BATTERY CELL MONITORING CIRCUIT AND BATTERY CELL MONITORING SYSTEM

CROSS-REFERENCE TO RELATED APPLICATION

This application is based upon and claims the benefit of priority from Japanese Patent Application No. 2012-070198, filed Mar. 26, 2012; the entire contents of which are incorporated herein by reference.

FIELD

Embodiments described herein relate to a battery cell monitoring circuit and a battery cell monitoring system.

BACKGROUND

In the prior art, there is a battery cell monitoring system having plural battery cell monitoring circuits connected in tandem (series) for monitoring battery cells, as well as a microcomputer for controlling the battery cells monitoring circuits. For a conventional battery cell monitoring system, if the delay time for the reciprocal transfer of a signal between the microcomputer and the farthest battery cell monitoring circuit is too long (more than half of one period of the clock), communication may not be possible. Consequently, it is necessary to limit the connection number of the battery cells connected to one series of battery cell monitoring circuits or to limit the communication frequency.

DETAILED DESCRIPTION

In general, the present disclosure provides a battery cell monitoring circuit that can monitor greater numbers of battery cells and have a higher communication frequency with the connected battery cells.

The battery cell monitoring system of the present disclosure has plural battery cell monitoring circuits for monitoring battery cells connected in tandem (in series). The battery cell monitoring system has a microcomputer that outputs a signal containing address information of the battery cell monitoring circuit that is assigned to generate and output a data signal and a clock signal, and controls the plural battery cell monitoring circuits.

A battery cell monitoring circuit has an address input terminal for input of the signal containing address information. The battery cell monitoring circuit has an address output terminal that outputs the signal containing the address information that is input via the address input terminal. The battery cell monitoring circuit has a clock input terminal for input of the clock signal. The battery cell monitoring circuit has a clock output terminal for output of the clock signal that is input via the clock input terminal. The battery cell monitoring circuit has a data input terminal for input of the data signal. The battery cell monitoring circuit has a data output terminal for output of the data signal. The battery cell monitoring circuit has a data output circuit that outputs the data signal based on the monitoring of the corresponding battery cell when the address is assigned by the signal containing the address information.

The battery cell monitoring circuit has a multiplexer with a multiplexer input terminal connected to the data input terminal and the output of the data output circuit and works as follows: when the battery cell monitoring circuit is designated by the signal containing the address information, the multiplexer selects and outputs the data signal output from the data output circuit. When the battery cell monitoring circuit is not designated by the signal containing the address information, the multiplexer selects and outputs the data signal input from the data input terminal.

The battery cell monitoring circuit has a flip-flop that works as follows: the clock signal that has been input to the clock input terminal is input to the flip-flop clock terminal; the signal output from the multiplexer is input to the flip-flop data terminal; the signal input to the data terminal is latched in synchronization with the clock signal, and the latched signal is output to the data output terminal.

Figure 1:
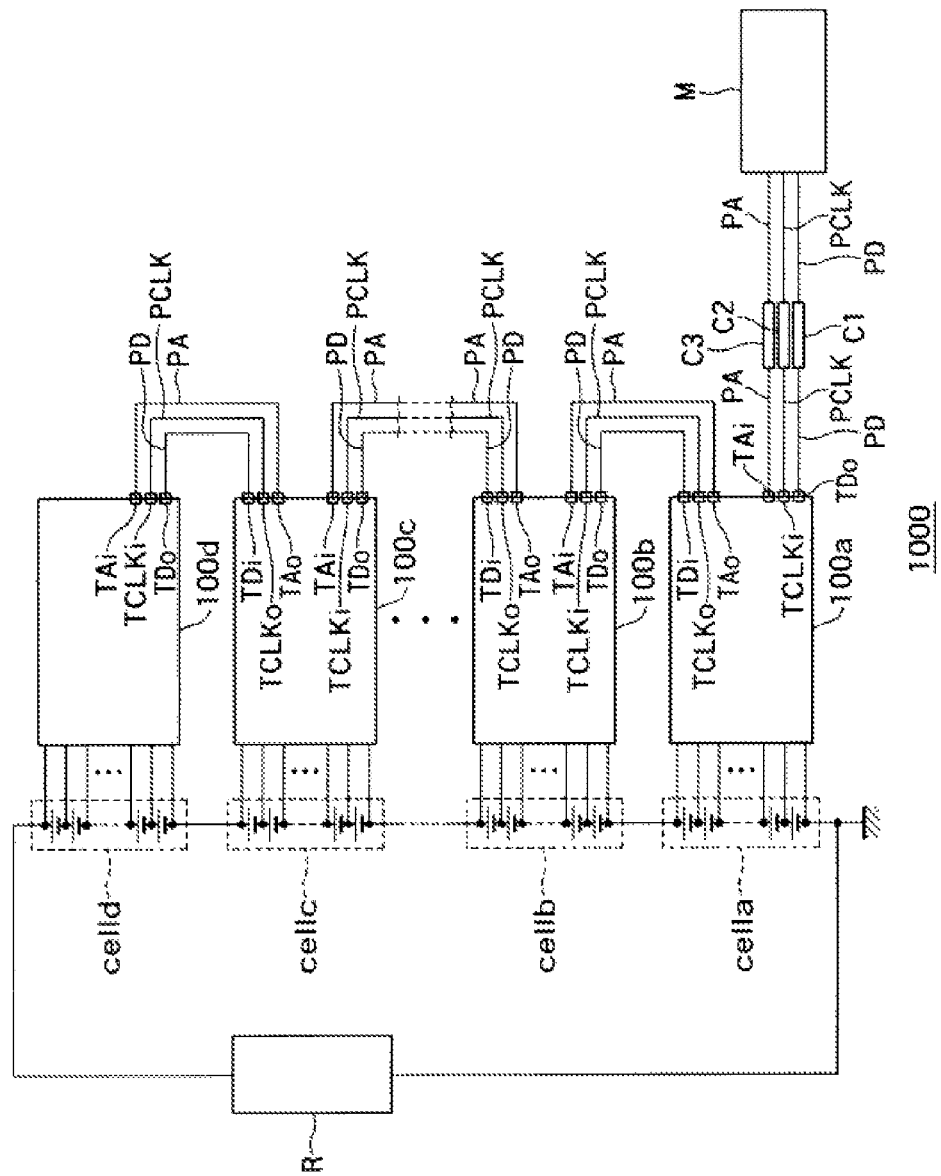
FIG. 1 is a diagram of a battery cell monitoring system according to a first embodiment.

FIG. 1 is a diagram illustrating an example of the constitution of the battery cell monitoring system 1000 according to the first embodiment. The battery cell monitoring system 1000 shown in FIG. 1 includes plural battery cell monitoring circuits 100a to 100d, insulating couplers C1, C2, C3, communication lines PA, PCLK, PD, and microcomputer M.

The battery cell monitoring circuits 100a to 100d monitor the corresponding battery cells Cella to Celld, respectively. The battery cells Cella to Celld are connected in tandem, and they feed electric power to the load R connected in parallel with the tandem connected battery cells.

The insulating couplers C1, C2, C3 are made of photocouplers or other elements that can provide electrical insulation between the communication lines that connect the battery cell monitoring circuit 100a and the microcomputer M.

The adjacent battery cell monitoring circuits are connected with each other by communication lines PA, PCLK, PD. For example, the address output terminal TAo of the battery cell monitoring circuit 100a is connected to the address input terminal TAi of the battery cell monitoring circuit 100b via communication line PA. The clock output terminal TCLKo of the battery cell monitoring circuit 100a is connected to the clock input terminal TCLKi of the battery cell monitoring circuit 100b via communication line PCLK. The data input terminal TDi of the battery cell monitoring circuit 100a is connected to the data output terminal TDo of the battery cell monitoring circuit 100b via communication line PD.

Also, the address input terminal TAi of the battery cell monitoring circuit 100a, which monitors the battery cell Cella on the ground potential side, has the signal containing the address information input from the microcomputer M via the communication line PA and insulating couple C3. The clock input terminal TCLKi has the clock signal input from the microcomputer M via the communication line PCLK and insulating coupler C2. In addition, the data signal is output from the data output terminal TDo to the microcomputer M via the communication line PD and the insulating coupler C1.

On the other hand, the address output terminal, clock output terminal and data input terminal of the battery cell monitoring circuit 100d that monitors the battery cell Celld on the power supply potential side are not connected to anywhere.

The microcomputer M outputs the signal containing the address information for assigning the battery cell monitoring circuit that generates and outputs the data signal, and controls plural battery cell monitoring circuits 100a to 100d. The microcomputer M specifies the head position of the data signal on the basis of the transfer time of the data signal from the assigned battery cell monitoring circuit to the microcomputer M.

Also, for example, the battery cell monitoring circuit assigned by the signal containing the address information controls the delay time of the transfer time of the data signal so that the head position of the data signal output from the battery cell monitoring circuit with respect to the microcomputer M is identical to that of the other battery cell monitoring circuits.

Here, it is preferred that the communication from the microcomputer M using the communication lines PA, PCLK, PD be synchronous with the clock signal output from the microcomputer M instead of asynchronous. One of the reasons is that in the case of asynchronous communication, at least one battery cell monitoring circuit should be adopted as the master of communication, and this leads to an increase in the size of the chip. Another reason is that, in the case of asynchronous communication, an oscillator should keep working on the battery cell monitoring circuit side, and this causes an increased current consumption.

Figure 2:
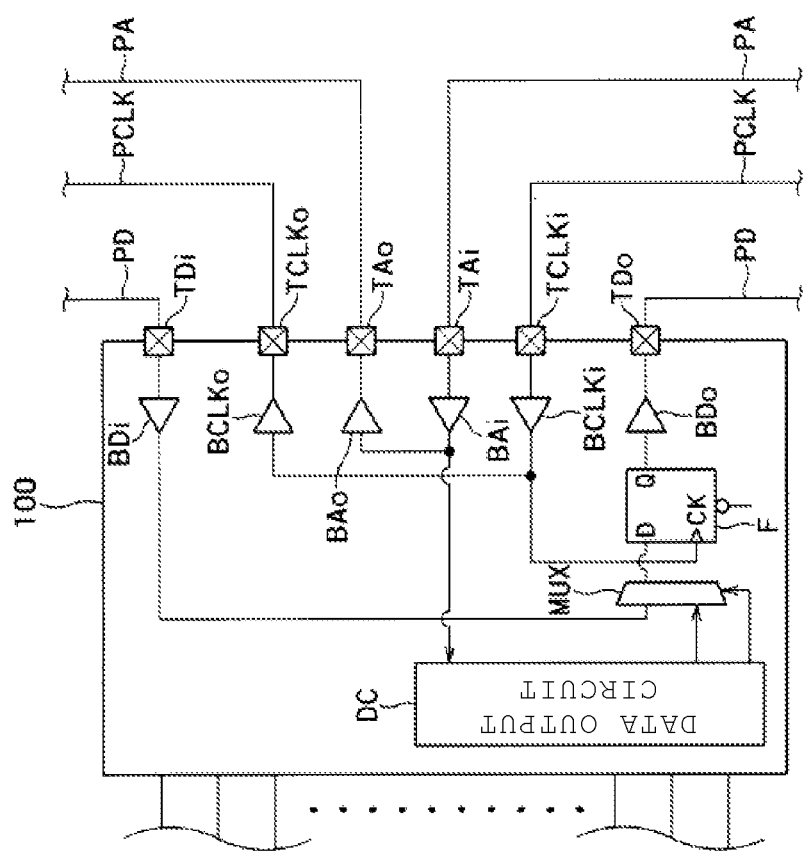
FIG. 2 is a diagram of a battery cell monitoring circuit depicted in FIG. 1.

FIG. 2 is a diagram illustrating an example of the constitution of the battery cell monitoring circuit 100. The battery cell monitoring circuit 100 shown in FIG. 2 has: a data output circuit DC, a multiplexer MUX, a D flip-flop F, an address input buffer BAi, an address output buffer BAo, a clock input buffer BCLKi, a clock output buffer BCLKo, a data input buffer BDi, and a data output buffer BDo. The battery cell monitoring circuit 100 also has: an address input terminal TAi, an address output terminal TAo, a clock input terminal TCLKi, a clock output terminal TCLKo, a data input terminal TDi, and a data output terminal TDo.

The address input terminal TAi has the signal containing the address information input to it. The address output terminal TAo outputs the signal containing the address information which is input via the address input terminal TAi. The address input buffer BAi is connected between the address input terminal TAi and the input of the data output circuit DC. The address output buffer BAo is connected between the output of the address input buffer BAi and the address output terminal TAo.

Specifically, the signal containing the address information input to the address input terminal TAi is output from the address output terminal TAo via the address input buffer BAi and the address output buffer BAo.

The clock signal is input to the clock input terminal TCLKi. The clock output terminal TCLKo outputs the clock signal input via the clock input terminal TCLKi. The clock input buffer BCLKi is connected between the clock input terminal TCLKi and the clock terminal CK of the D flip-flop F. The clock output buffer BCLKo is connected between the output of the clock input buffer BCLKi and the clock output terminal TCLKo.

Specifically, the clock signal input to the clock input terminal TCLKi is output from the clock output terminal TCLKo via the clock input buffer BCLKi and the clock output buffer BCLKo.

The data input terminal TDi receives the data signal as input. The data output terminal TDo outputs this data signal. The data input buffer BDi is connected between the data input terminal TDi and the input of the multiplexer MUX. The data output buffer BDo is connected between the output Q of the D flip-flop F and the data output terminal TDo.

When the specific battery cell monitoring circuit 100 is assigned by the signal containing the address information, the data output circuit DC outputs the data signal corresponding to the result of monitoring of the corresponding battery cell CellX (where X corresponds to the assigned address value). The result of the monitoring includes, e.g., the voltage of the battery cell CellX, and the temperature of the battery cell CellX, etc. In addition, when the battery cell monitoring circuit 100 is assigned by the signal containing the address information, the data output circuit DC controls the multiplexer MUX so that the data signal monitoring the corresponding battery cell CellX is selected.

The data signal of the data input terminal TDi and the data output circuit DC is input to the multiplexer MUX. Also, the data signal of the data input terminal TDi is input to the multiplexer MUX via the data input buffer DBi. When assigned by the signal containing the address information, the multiplexer MUX outputs the data signal of the data output circuit DC. On the other hand, when not assigned by the signal containing the address information, the multiplexer MUX outputs the data signal from the data input terminal TDi. The data signal selected by the multiplexer MUX is output to the data output terminal TDo via the D flip-flop F and the data output buffer BDo.

For the D flip-flop F, the clock signal input to the clock input terminal TCLKi is input to the clock terminal CK via the clock input buffer BCLKi, and the data signal output from the multiplexer MUX is input to the data terminal D. The D flip-flop F outputs the latched data signal to the data output terminal TDo in synchronization with the input clock signal.

If the path from the address input terminal TAi to the address output terminal TAo via the address input buffer BAi and the address output buffer BAo, and the path from the clock input terminal TCLKi to the clock output terminal TCLKo via the clock input buffer BCLKi and clock output buffer BCLKo have the same delay time, then there is no need to consider the difference in the delay time between the signal containing the address information and the clock signal.

The battery cell monitoring circuit 100d has a constitution that omits (or leaves unconnected) the data input terminal TDi, the clock output terminal TCLKo, the address output terminal TAo, the address output buffer BAo, the clock output buffer BCLKo, and the data input buffer BDi. However, one may also adopt a scheme in which the battery cell monitoring circuit 100d has the same constitution as that shown in FIG. 2.

In the example shown in FIG. 2, the data input terminal TDi is arranged separated from the address input terminal TAi, and the data output terminal TDo is arranged separated from the address output terminal TAo. However, one may also adopt a scheme in which the data input terminal TDi is common with the address input terminal TAi, and the data output terminal TDo is common with address output terminal TAo. In this case, for example, control is carried out so that the transfer timing for the signal containing the address information and the transfer timing for the data signal are different from each other.

In the following, an example of the operation of the battery cell monitoring system 1000 having this constitution (common input/output terminals) will be explained. According to the constitution of this application example, when the number of sections of the battery cell monitoring circuits connected in tandem is increased, the delay time of the clock signal from the various battery cell monitoring circuits with respect to the microcomputer M increases. As an example, consider the case when the transferred data signal is output from the various data output circuits in synchronization with the rising edge of the clock signal from the microcomputer M, and the data are latched by the microcomputer M at the falling edge of the clock signal.

Figure 3:
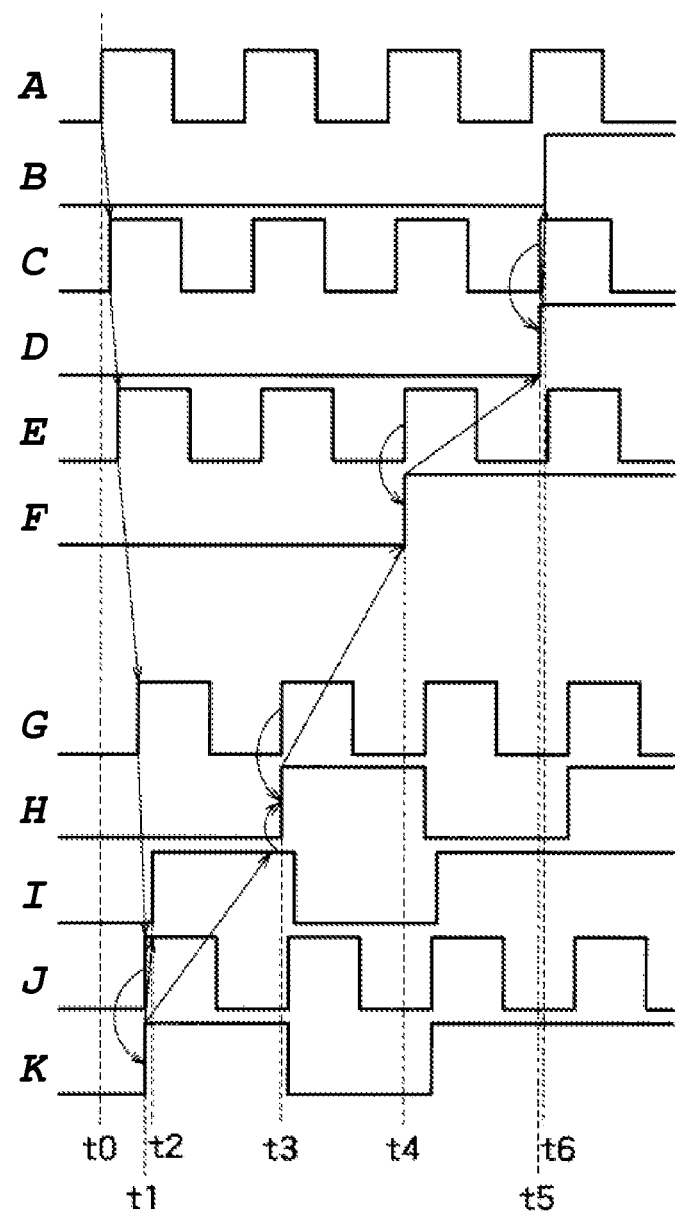
FIG. 3 is a diagram illustrating an example of the waveforms of the various clock signals and data signals of the battery cell monitoring system depicted in FIG. 1.

FIG. 3 is a signal time chart illustrating an example of the waveforms of the clock signal and data signal of the battery cell monitoring system in this embodiment. In the example in FIG. 3, the case when the battery cell monitoring circuit 100d is assigned by the signal containing the address information is shown.

Waveform A in FIG. 3 shows the clock signal output from the microcomputer M, and waveform B shows the data signal input to the microcomputer M. Waveform C shows the clock signal input to the battery cell monitoring circuit 100a, and waveform D shows the data signal output from the battery cell monitoring circuit 100a. Waveform E shows the clock signal input to the battery cell monitoring circuit 100b, and waveform F shows the data signal output from the battery cell monitoring circuit 100b. Waveform G shows the clock signal input to the battery cell monitoring circuit 100c, and waveform H shows the data signal output from the battery cell monitoring circuit 100c. Waveform I shows the data signal output from the battery cell monitoring circuit 100d and received by the battery cell monitoring circuit 100c, waveform J shows the clock signal input to the battery cell monitoring circuit 100d, and waveform K shows the data signal output from the battery cell monitoring circuit 100d.

The clock signal in waveform A output from the microcomputer M is delayed by time t0 to time t1 as it is transferred as the clock signal in waveform J to the battery cell monitoring circuit 100d. In addition, the battery cell monitoring circuit 100d outputs the high level data signal in waveform K at time t1 of the rising edge of the clock signal in waveform J.

Then, the battery cell monitoring circuit 100c receives the data signal in waveform I at the high level at time t2. The battery cell monitoring circuit 100c has the received data signal in waveform I latched at the time t3 of the rising edge of the next clock signal, in waveform G, delayed by a period from the rising edge of the clock signal that starts the output of the data signal, and it outputs the data signal waveform H to the battery cell monitoring circuit 100b.

Similarly, the battery cell monitoring circuit 100b has the received data signal latched at time t4 of the rising edge of the clock signal in waveform E, and it outputs the data signal in waveform F to the battery cell monitoring circuit 100a. The battery cell monitoring circuit 100a has the received data signal latched at the time t5 of the rising edge of the clock signal in waveform C, and outputs the data signal in waveform D to the battery cell monitoring circuit 100b.

Consequently, the microcomputer M receives the data signal in waveform B, at the high level and at time t6, delayed by the clocks in the same number as the number of sections of the battery cell monitoring circuits where the data passed, and the delay in time generated in the communication line and the insulating coupler.

As explained above, the microcomputer M can always acquire the data at the prescribed timing (as shown in FIG. 3, the signal from the battery cell monitoring circuit at the rising edge of the clock). According to this; application example, although the absolute delay time of communication of the data extends, the delay times of the various battery cell monitoring circuits are, nevertheless, not accumulated. Consequently, there is no need to decrease the frequency adopted in the communication even when the number of the sections of the battery cell monitoring circuits is increased. As a result, communication of the microcomputer M is kept independent of the number of sections of the battery cell monitoring circuits and the highest communication frequency. Therefore, it is possible to improve the freedom related to the number of sections of connection of the battery cell monitoring circuits and the highest communication frequency.

In addition, on the basis of the delay time of the clock signal between the battery cell monitoring circuits assigned by the microcomputer M and the transfer time of the data signal, the assigned battery cell monitoring circuit controls the timing of the output of the data signals so that head positions of the data signals output from the battery cell monitoring circuits assigned with respect to the microcomputer M are identical to each other. As a result, the microcomputer M can latch the data signals at the same timing.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A battery cell monitoring system, comprising:
  a plurality of battery cell monitoring circuits for monitoring battery cells connected in series; and
  a microcomputer that outputs an address signal containing address information designating one or more of the battery cell monitoring circuits for generating a data signal and a clock signal;
  wherein each battery cell monitoring circuit of the plurality comprises:
    an address input terminal for input of the address signal;
    an address output terminal for output of the address signal;
    a clock input terminal for input of the clock signal;
    a clock output terminal for output of the clock signal;
    a data output circuit for output of a data signal corresponding to a battery cell monitoring result;
    a data input terminal for input of the data signal from another battery monitoring circuit;
    a data output terminal;
    a multiplexer having an input terminal connected to the data input terminal and the data output circuit, wherein the multiplexer is configured to receive data signals through the data input terminal and from the data output circuit and to output the data signal received from the data output circuit when the battery cell monitoring circuit is the designated battery cell monitoring circuit and to output the data signal received through the data input terminal otherwise; and
    a flip-flop circuit having a clock input terminal for receiving the clock signal and a data terminal for receiving the data signal from the multiplexer, wherein the flip-flop circuit latches the data signal from the multiplexer in synchronization with the clock signal, and the latched data signal is output to the data output terminal.

2. The battery cell monitoring system according to claim 1, wherein
the plurality of battery monitoring circuits includes a first battery cell monitoring circuit and a second battery cell monitoring circuit,
the first battery cell monitoring circuit having the address input terminal, the clock input terminal, and the data output terminal connected to the microcomputer without another battery cell monitoring circuit connected between the first battery cell monitoring circuit and the microcomputer, and
the second battery cell monitoring circuit having the address input terminal, the clock input terminal, and the data output terminal connected to the address output terminal, the clock output terminal, and the data input terminal of the first battery cell monitoring circuit, respectively.

3. The battery cell monitoring system according to claim 2, wherein the address input terminal and the data output terminal are implemented as an input-output terminal that is configured to switch between operating as the address input terminal and operating as the data output terminal.

4. The battery cell monitoring system according to claim 3, wherein connections between the first battery cell monitoring circuit and the microcomputer each include an insulating coupler.

5. The battery cell monitoring system according to claim 1, further comprising:
a last battery monitoring circuit connected to one of the plurality of battery monitoring circuits, the last battery monitoring circuit having an address input terminal, a clock input terminal, and a data output terminal connected to the address output terminal, the clock output terminal, and the data input terminal of the one of the plurality of battery cell monitoring circuit, respectively.

6. The battery cell monitoring system according to claim 5, wherein the last battery monitoring circuit does not include an address output terminal, a clock output terminal, and a data input terminal.

7. The battery cell monitoring system according to claim 1, wherein one battery cell monitoring circuit of the plurality has nothing connected to the address output terminal, the clock output terminal, and the data input terminal.

8. The battery cell monitoring system according to claim 1, the battery monitoring circuits each further comprising:
an address input buffer connected between the address input terminal and an input of the data output circuit;
an address output buffer connected between an output of the address input buffer and the address output terminal;
a clock input buffer connected between the clock input terminal and the clock terminal of the flip-flop circuit;
a clock output buffer connected between an output of the clock input buffer and the clock output terminal;
a data input buffer connected between the data input terminal and an input of the multiplexer; and
a data output buffer connected between an output of the flip-flop circuit and the data output terminal.

9. The battery cell monitoring system according to claim 8, wherein a transfer delay time of the address signal from the address input terminal to the address output terminal of the battery cell monitoring circuit is configured to be equal to a transfer delay time of the clock signal from the clock input terminal to the clock output terminal.

10. The battery cell monitoring system according to claim 1, wherein on the basis of a delay time of the clock signal from the microcomputer to the assigned selected battery cell monitoring circuit and a transfer time of the data signal from the selected battery cell monitoring circuit to the microcomputer, the selected battery cell monitoring circuit is configured to control a timing of the output of the data signal so that head positions of data signals output from the battery cell monitoring circuits are approximately the same.

11. The battery cell monitoring system according to claim 1, wherein communication between the microcomputer and the plurality of battery cell monitoring circuits is synchronous with the clock signal.

12. A monitoring circuit for a battery cell, comprising:
an address input terminal for input of an address signal designating a selected battery cell monitoring circuit;
an address output terminal for output of the address signal;
a clock input terminal for input of a clock signal;
a clock output terminal for output of the clock signal;
a data output circuit configured to output a data signal corresponding to a monitoring result for the battery cell;
a data input terminal for input of data signals from other battery cell monitoring circuits;
a data output terminal;
a multiplexer having an input terminal connected to the data input terminal and the data output circuit, wherein the multiplexer is configured receive data signals through the data input terminal and from the data output circuit and to output the data signal received from the data output circuit when the monitoring circuit is selected and to output the data signal received through the data input terminal otherwise; and
a flip-flop circuit having a clock input terminal for receiving the clock signal and a data terminal for receiving the data signal from the multiplexer, wherein the flip-flop circuit latches the data signal from the multiplexer in synchronization with the clock signal, and the latched data signal is output to the data output terminal.

13. The monitoring circuit according to claim 12, wherein the address input terminal and the data output terminal are implemented as an input-output terminal that is configured to switch between operating as the address input terminal and operating as the data output terminal.

14. The monitoring circuit according to claim 13, further comprising:
an address input buffer connected between the address input terminal and an input of the data output circuit;
an address output buffer connected between an output of the address input buffer and the address output terminal;
a clock input buffer connected between the clock input terminal and the clock terminal of the flip-flop circuit;
a clock output buffer connected between an output of the clock input buffer and the clock output terminal;
a data input buffer connected between the data input terminal and an input of the multiplexer, and
a data output buffer connected between an output of the flip-flop circuit and the data output terminal.

15. The monitoring circuit according to claim 13, wherein the address input terminal, the clock signal input terminal, and the data output terminal are connected to a microcomputer providing the address signal and the clock signal.

16. The monitoring circuit according to claim 15, wherein on the basis of a delay time of the clock signal from the microcomputer to the battery cell monitoring circuit and a transfer time of the data signal from the battery cell monitoring circuit to the microcomputer, the battery cell monitoring circuit is configured to control a timing of the output of the data signal.

* * * * *